United States Patent [19]

Niwa et al.

[11] Patent Number: 5,341,315

[45] Date of Patent: Aug. 23, 1994

[54] TEST PATTERN GENERATION DEVICE

[75] Inventors: Hisao Niwa, Osaka; Kazuhiro Kayashima, Hirakata, both of Japan

[73] Assignee: Matsushita Electric Industrial Co., Ltd., Osaka, Japan

[21] Appl. No.: 850,877

[22] Filed: Mar. 13, 1992

[30] Foreign Application Priority Data

Mar. 14, 1991 [JP] Japan .................................. 3-049406
Aug. 30, 1991 [JP] Japan .................................. 3-219891

[51] Int. Cl.$^5$ ............................................. G01R 31/28
[52] U.S. Cl. ................................... 364/580; 371/23; 371/27
[58] Field of Search ................. 371/23, 27; 364/551.1, 364/579, 580

[56] References Cited

U.S. PATENT DOCUMENTS 3,961,250  6/1976  Snether ............................ 324/73 R
4,672,307  6/1987  Breuer et al. ..................... 371/27 X

FOREIGN PATENT DOCUMENTS 0342787    4/1989  European Pat. Off. .
92104350.1 7/1992  European Pat. Off. .

OTHER PUBLICATIONS

"An Engineering Approach To Digital Design", William I. Fletcher, Prentice-Hall Inc 1980, pp. 2-8.

"A Simulation-Based Method for Generating Tests for Sequential Circuits", Cheng et al., IEEE Transactions on Computers, vol. 39 No. 12, Dec. 1990, pp. 1456-1463.

"Smart and Fast: Test Gen. for ULSI Scandesign Circuits" by M. Abromovici et al. pp. 43-54 (Aug., 1986).

"A Sey. Circuit . . . Simulation" by K. T. Cheng et al., pp. 24-29 (1988 IEEE).

"A Backtrackless Test Generation Method for Combinational Circuits", Ikeda et al., Oct. 25, 1989, pp. 83-87, English Abstract Only.

"Method for Preparing a Logic Function Table of a Flip-Flop", Matsushita Electrical Industries Co. Ltd., Niwa et al., Mar. 25, 1991, pp. 1-2 with English Translation.

Primary Examiner—Jack B. Harvey
Assistant Examiner—Eric W. Sjamber
Attorney, Agent, or Firm—Ratner & Prestia

[57] ABSTRACT

A test pattern generation device for producing test pattern signals for testing a preselected digital circuit includes a dominant pattern signal generator and a subservient pattern signal generator. When a first dominant pattern signal (0,0,0,0,0) is generated, five subservient pattern signals (1,0,0,0,0), (0,1,0,0,0), (0,0,1,0,0), (0,0,0,1,0) and (0,0,0,0,1) are generated, each being unit Hamming distance from the dominant pattern signal. The subservient pattern signals are sequentially applied to a simulator carrying a hypothetical digital circuit for producing a controllability cost $CCO_f$ and a continuous cyclic logic value $CV_f$ at a preselected line $G_f$ in the digital circuit for each subservient pattern signal. A cost generator produces an evaluation cost $CT_f$ by the use of the controllability cost $CCO_f$ and the continuous cyclic logic value $CV_f$ for each subservient pattern signal. A selector selects from the set of subservient pattern signals a subservient pattern signal that produced a minimum evaluation cost $CT_f$; test pattern memory stores the selected subservient pattern signal as one test pattern and assigns the selected subservient pattern signal as a next dominant pattern signal in a next cycle operation.

5 Claims, 23 Drawing Sheets

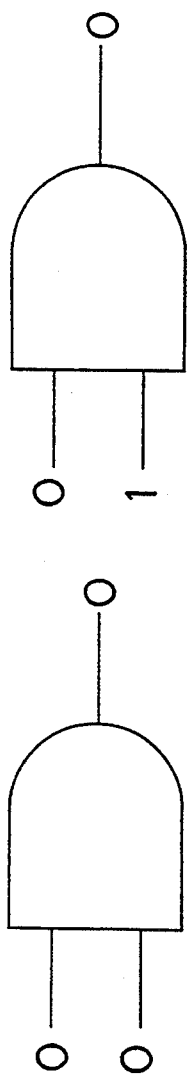
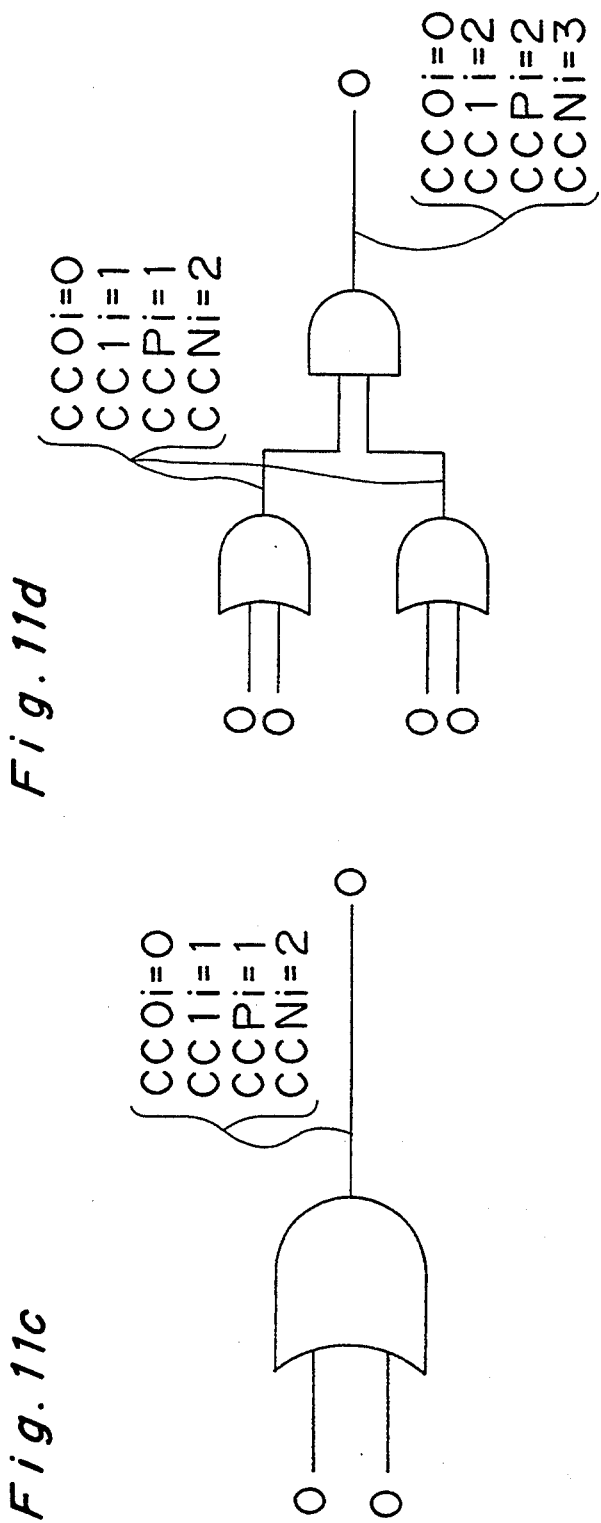
Fig.11a  Fig.11b  Fig.11c  Fig.11d

Fig. 12a

|    | 0  | 1  | 2  | 3  | 4  | 5  | 6  | 7  | 8  | 9  | 10 | 11 | 12 | 13 | 14 |
|----|----|----|----|----|----|----|----|----|----|----|----|----|----|----|----|
| 0  | 0  | 0  | 1  | 1  | 1  | 1  | 1  | 1  | 1  | 1  | 1  | 29 | 29 | 29 | 29 |
| 1  | 1  | 1  | 1  | 1  | 1  | 1  | 1  | 1  | 1  | 1  | 1  | 29 | 29 | 29 | 29 |
| 2  | 2  | 1  | 1  | 1  | 1  | 1  | 1  | 1  | 1  | 1  | 1  | 29 | 29 | 29 | 29 |
| 3  | 3  | 1  | 1  | 2  | 2  | 2  | 2  | 2  | 2  | 2  | 2  | 28 | 28 | 28 | 28 |
| 4  | 4  | 1  | 1  | 2  | 2  | 2  | 2  | 2  | 2  | 2  | 2  | 28 | 28 | 28 | 28 |
| 5  | 5  | 1  | 1  | 2  | 2  | 7  | 7  | 7  | 8  | 8  | 8  | 12 | 12 | 12 | 12 |
| 6  | 6  | 1  | 1  | 2  | 2  | 7  | 7  | 8  | 8  | 8  | 8  | 12 | 12 | 12 | 12 |
| 7  | 7  | 1  | 1  | 2  | 2  | 7  | 8  | 8  | 8  | 8  | 8  | 12 | 12 | 12 | 12 |
| 8  | 8  | 1  | 1  | 1  | 2  | 2  | 8  | 8  | 8  | 8  | 8  | 12 | 12 | 12 | 12 |
| 9  | 9  | 1  | 1  | 1  | 2  | 2  | 8  | 8  | 8  | 8  | 9  | 9  | 11 | 12 | 12 |
| 10 | 10 | 1  | 1  | 1  | 2  | 2  | 8  | 8  | 8  | 8  | 9  | 10 | 11 | 12 | 12 |
| 11 | 11 | 29 | 29 | 29 | 28 | 28 | 12 | 12 | 12 | 12 | 11 | 11 | 11 | 12 | 12 |
| 12 | 12 | 29 | 29 | 29 | 28 | 28 | 12 | 12 | 12 | 12 | 12 | 12 | 12 | 12 | 13 |
| 13 | 13 | 29 | 29 | 29 | 28 | 28 | 12 | 12 | 12 | 12 | 12 | 12 | 12 | 13 | 13 |
| 14 | 14 | 29 | 29 | 29 | 28 | 28 | 12 | 12 | 12 | 12 | 12 | 12 | 12 | 13 | 13 |

Fig. 12b

| | 15 | 16 | 17 | 18 | 19 | 20 | 21 | 22 | 23 | 24 | 25 | 26 | 27 | 28 | 29 |
|---|---|---|---|---|---|---|---|---|---|---|---|---|---|---|---|
| | 28 | 28 | 28 | 28 | 28 | 28 | 28 | 28 | 28 | 29 | 29 | 29 | 29 | 29 | |
| | 28 | 28 | 28 | 28 | 28 | 28 | 28 | 28 | 28 | 29 | 29 | 29 | 29 | 29 | |
| | 28 | 28 | 28 | 28 | 28 | 28 | 28 | 28 | 28 | 29 | 29 | 29 | 29 | 29 | |
| | 28 | 28 | 28 | 28 | 28 | 28 | 28 | 28 | 28 | 29 | 29 | 29 | 29 | 29 | |
| | 28 | 28 | 28 | 28 | 28 | 28 | 28 | 28 | 28 | 29 | 29 | 29 | 29 | 29 | |
| | 18 | 18 | 18 | 18 | 18 | 18 | 22 | 23 | 23 | 23 | 29 | 29 | 29 | 29 | 29 |
| | 18 | 18 | 18 | 18 | 18 | 18 | 22 | 22 | 23 | 23 | 29 | 29 | 29 | 29 | 29 |
| | 18 | 18 | 18 | 18 | 18 | 18 | 22 | 22 | 22 | 23 | 29 | 29 | 29 | 29 | 29 |
| | 18 | 18 | 18 | 18 | 18 | 18 | 22 | 22 | 22 | 29 | 29 | 29 | 29 | 29 | 29 |
| | 18 | 18 | 18 | 18 | 18 | 18 | 22 | 22 | 22 | 29 | 29 | 29 | 29 | 29 | 29 |
| | 18 | 18 | 18 | 18 | 18 | 18 | 22 | 22 | 22 | 29 | 29 | 29 | 29 | 29 | 29 |
| | 18 | 18 | 18 | 18 | 18 | 18 | 22 | 22 | 22 | 29 | 29 | 29 | 29 | 29 | 29 |
| | 18 | 18 | 18 | 18 | 18 | 18 | 22 | 22 | 22 | 29 | 29 | 29 | 29 | 29 | 29 |
| | 18 | 18 | 18 | 18 | 18 | 18 | 22 | 22 | 22 | 29 | 29 | 29 | 29 | 29 | 29 |
| | 18 | 18 | 18 | 18 | 18 | 18 | 22 | 22 | 22 | 29 | 29 | 29 | 29 | 29 | 29 |

Fig. 12c

| 15 | 16 | 17 | 18 | 19 | 20 | 21 | 22 | 23 | 24 | 25 | 26 | 27 | 28 | 29 |
|----|----|----|----|----|----|----|----|----|----|----|----|----|----|----|
| 28 | 28 | 28 | 28 | 28 | 28 | 28 | 28 | 28 | 28 | 29 | 29 | 29 | 29 | 29 |
| 28 | 28 | 28 | 28 | 28 | 28 | 28 | 28 | 28 | 28 | 29 | 29 | 29 | 29 | 29 |
| 28 | 28 | 28 | 28 | 28 | 28 | 28 | 28 | 28 | 28 | 29 | 29 | 29 | 29 | 29 |
| 28 | 28 | 28 | 28 | 28 | 28 | 28 | 28 | 28 | 28 | 29 | 29 | 29 | 29 | 29 |
| 28 | 28 | 28 | 28 | 28 | 28 | 28 | 28 | 28 | 28 | 29 | 29 | 29 | 29 | 29 |
| 18 | 18 | 18 | 18 | 18 | 18 | 22 | 23 | 23 | 23 | 29 | 29 | 29 | 29 | 29 |
| 18 | 18 | 18 | 18 | 18 | 18 | 22 | 22 | 23 | 23 | 29 | 29 | 29 | 29 | 29 |
| 18 | 18 | 18 | 18 | 18 | 18 | 22 | 22 | 22 | 23 | 29 | 29 | 29 | 29 | 29 |
| 18 | 18 | 18 | 18 | 18 | 18 | 22 | 22 | 22 | 22 | 29 | 29 | 29 | 29 | 29 |
| 18 | 18 | 18 | 18 | 18 | 18 | 22 | 22 | 22 | 22 | 29 | 29 | 29 | 29 | 29 |
| 18 | 18 | 18 | 18 | 18 | 18 | 22 | 22 | 22 | 22 | 29 | 29 | 29 | 29 | 29 |
| 18 | 18 | 18 | 18 | 18 | 18 | 22 | 22 | 22 | 22 | 29 | 29 | 29 | 29 | 29 |
| 18 | 18 | 18 | 18 | 18 | 18 | 22 | 22 | 22 | 22 | 29 | 29 | 29 | 29 | 29 |
| 18 | 18 | 18 | 18 | 18 | 18 | 22 | 22 | 22 | 22 | 29 | 29 | 29 | 29 | 29 |

Fig. 12d

| 28 | 28 | 28 | 28 | 28 | 28 | 28 | 28 | 28 | 28 | 29 | 29 | 29 | 29 | 29 |
| --- | --- | --- | --- | --- | --- | --- | --- | --- | --- | --- | --- | --- | --- | --- |
| 28 | 28 | 28 | 28 | 28 | 28 | 28 | 28 | 28 | 28 | 29 | 29 | 29 | 29 | 29 |
| 28 | 28 | 28 | 28 | 28 | 28 | 28 | 28 | 28 | 28 | 29 | 29 | 29 | 29 | 29 |
| 28 | 28 | 28 | 28 | 28 | 28 | 28 | 28 | 28 | 28 | 29 | 29 | 29 | 29 | 29 |
| 28 | 28 | 28 | 28 | 28 | 28 | 28 | 28 | 28 | 28 | 29 | 29 | 29 | 29 | 29 |
| 22 | 22 | 22 | 22 | 22 | 22 | 22 | 23 | 23 | 23 | 28 | 28 | 28 | 28 | 28 |
| 22 | 22 | 22 | 22 | 22 | 22 | 22 | 22 | 23 | 23 | 28 | 28 | 28 | 28 | 28 |
| 22 | 22 | 22 | 22 | 22 | 22 | 22 | 22 | 23 | 28 | 28 | 28 | 28 | 28 | 28 |
| 22 | 22 | 22 | 22 | 21 | 21 | 21 | 22 | 22 | 22 | 28 | 28 | 28 | 28 | 28 |
| 19 | 19 | 19 | 19 | 19 | 20 | 21 | 22 | 22 | 22 | 28 | 28 | 28 | 28 | 28 |
| 19 | 19 | 19 | 19 | 19 | 19 | 21 | 22 | 22 | 22 | 28 | 28 | 28 | 28 | 28 |
| 19 | 19 | 19 | 19 | 19 | 19 | 22 | 22 | 22 | 22 | 28 | 28 | 28 | 28 | 28 |
| 19 | 19 | 19 | 19 | 19 | 19 | 22 | 22 | 22 | 22 | 28 | 28 | 28 | 28 | 28 |
| 19 | 19 | 19 | 19 | 19 | 19 | 22 | 22 | 22 | 22 | 28 | 28 | 28 | 28 | 28 |
| 19 | 19 | 19 | 19 | 19 | 19 | 22 | 22 | 22 | 22 | 28 | 28 | 28 | 28 | 28 |

Fig. 13a

| | 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| 14 | 11 | 11 | 11 | 11 | 11 | 11 | 11 | 11 | 11 | 11 | 11 | 11 | 11 | 11 | 11 |
| 13 | 11 | 11 | 11 | 11 | 11 | 11 | 11 | 11 | 11 | 11 | 11 | 11 | 11 | 11 | 11 |
| 12 | 11 | 11 | 11 | 11 | 11 | 11 | 11 | 11 | 11 | 11 | 11 | 11 | 11 | 11 | 11 |
| 11 | 11 | 11 | 11 | 11 | 11 | 11 | 11 | 11 | 11 | 11 | 11 | 11 | 11 | 11 | 11 |
| 10 | 9 | 9 | 9 | 9 | 9 | 9 | 9 | 9 | 9 | 9 | 10 | 11 | 11 | 11 | 11 |
| 9 | 9 | 9 | 9 | 9 | 9 | 9 | 9 | 9 | 9 | 9 | 9 | 11 | 11 | 11 | 11 |
| 8 | 9 | 9 | 9 | 9 | 9 | 9 | 9 | 9 | 9 | 9 | 9 | 11 | 11 | 11 | 11 |
| 7 | 9 | 9 | 9 | 9 | 9 | 9 | 9 | 9 | 9 | 9 | 9 | 11 | 11 | 11 | 11 |
| 6 | 8 | 8 | 8 | 8 | 8 | 8 | 9 | 9 | 9 | 9 | 9 | 11 | 11 | 11 | 11 |
| 5 | 8 | 8 | 8 | 8 | 8 | 8 | 9 | 9 | 9 | 9 | 9 | 11 | 11 | 11 | 11 |
| 4 | 2 | 2 | 3 | 3 | 3 | 8 | 8 | 9 | 9 | 9 | 9 | 11 | 11 | 11 | 11 |
| 3 | 2 | 2 | 2 | 3 | 3 | 8 | 8 | 9 | 9 | 9 | 9 | 11 | 11 | 11 | 11 |
| 2 | 2 | 2 | 2 | 2 | 3 | 8 | 8 | 9 | 9 | 9 | 9 | 11 | 11 | 11 | 11 |
| 1 | 1 | 1 | 2 | 2 | 2 | 8 | 8 | 9 | 9 | 9 | 9 | 11 | 11 | 11 | 11 |
| 0 | 0 | 1 | 2 | 2 | 2 | 8 | 8 | 9 | 9 | 9 | 9 | 11 | 11 | 11 | 11 |

Fig. 13b

| | | | | | | | | | | | | | | |
|---|---|---|---|---|---|---|---|---|---|---|---|---|---|---|
| 12 | 12 | 12 | 12 | 12 | 12 | 12 | 12 | 12 | 12 | 11 | 11 | 11 | 11 | 11 |
| 12 | 12 | 12 | 12 | 12 | 12 | 12 | 12 | 12 | 12 | 11 | 11 | 11 | 11 | 11 |
| 12 | 12 | 12 | 12 | 12 | 12 | 12 | 12 | 12 | 12 | 11 | 11 | 11 | 11 | 11 |
| 12 | 12 | 12 | 12 | 12 | 12 | 12 | 12 | 12 | 12 | 11 | 11 | 11 | 11 | 11 |
| 12 | 12 | 12 | 12 | 12 | 12 | 12 | 12 | 12 | 12 | 11 | 11 | 11 | 11 | 11 |
| 12 | 12 | 12 | 12 | 12 | 12 | 12 | 12 | 12 | 12 | 11 | 11 | 11 | 11 | 11 |
| 12 | 12 | 12 | 12 | 12 | 12 | 12 | 12 | 12 | 12 | 11 | 11 | 11 | 11 | 11 |
| 12 | 12 | 12 | 12 | 12 | 12 | 12 | 12 | 12 | 12 | 11 | 11 | 11 | 11 | 11 |
| 12 | 12 | 12 | 12 | 12 | 12 | 12 | 12 | 12 | 12 | 12 | 12 | 12 | 12 | 12 |
| 12 | 12 | 12 | 12 | 12 | 12 | 12 | 12 | 12 | 12 | 12 | 12 | 12 | 12 | 12 |
| 22 | 22 | 22 | 22 | 22 | 22 | 22 | 22 | 22 | 22 | 28 | 28 | 28 | 28 | 28 |
| 22 | 22 | 22 | 22 | 22 | 22 | 22 | 22 | 22 | 22 | 28 | 28 | 28 | 28 | 28 |
| 22 | 22 | 22 | 22 | 22 | 22 | 22 | 22 | 22 | 22 | 28 | 28 | 28 | 28 | 28 |
| 22 | 22 | 22 | 22 | 22 | 22 | 22 | 22 | 22 | 22 | 28 | 28 | 28 | 28 | 29 |
| 22 | 22 | 22 | 22 | 22 | 22 | 22 | 22 | 22 | 22 | 28 | 28 | 28 | 28 | 29 |
| 15 | 16 | 17 | 18 | 19 | 20 | 21 | 22 | 23 | 24 | 25 | 26 | 27 | 28 | 29 |

Fig. 13c

| 15 | 16 | 17 | 18 | 19 | 20 | 21 | 22 | 23 | 24 | 25 | 26 | 27 | 28 | 29 |
|----|----|----|----|----|----|----|----|----|----|----|----|----|----|----|
| 22 | 22 | 22 | 22 | 22 | 22 | 22 | 22 | 22 | 22 | 28 | 28 | 28 | 28 | 29 |
| 22 | 22 | 22 | 22 | 22 | 22 | 22 | 22 | 22 | 22 | 28 | 28 | 28 | 28 | 29 |
| 22 | 22 | 22 | 22 | 22 | 22 | 22 | 22 | 22 | 22 | 28 | 28 | 28 | 28 | 29 |
| 22 | 22 | 22 | 22 | 22 | 22 | 22 | 22 | 22 | 22 | 28 | 28 | 28 | 28 | 28 |
| 22 | 22 | 22 | 22 | 22 | 22 | 22 | 22 | 22 | 22 | 28 | 28 | 28 | 28 | 28 |
| 12 | 12 | 12 | 12 | 12 | 12 | 12 | 12 | 12 | 12 | 28 | 28 | 28 | 28 | 28 |
| 12 | 12 | 12 | 12 | 12 | 12 | 12 | 12 | 12 | 12 | 12 | 12 | 12 | 12 | 12 |
| 12 | 12 | 12 | 12 | 12 | 12 | 12 | 12 | 12 | 12 | 11 | 11 | 11 | 11 | 11 |
| 12 | 12 | 12 | 12 | 12 | 12 | 12 | 12 | 12 | 12 | 11 | 11 | 11 | 11 | 11 |
| 12 | 12 | 12 | 12 | 12 | 12 | 12 | 12 | 12 | 12 | 11 | 11 | 11 | 11 | 11 |
| 12 | 12 | 12 | 12 | 12 | 12 | 12 | 12 | 12 | 12 | 11 | 11 | 11 | 11 | 11 |
| 12 | 12 | 12 | 12 | 12 | 12 | 12 | 12 | 12 | 12 | 11 | 11 | 11 | 11 | 11 |
| 12 | 12 | 12 | 12 | 12 | 12 | 12 | 12 | 12 | 12 | 11 | 11 | 11 | 11 | 11 |
| 12 | 12 | 12 | 12 | 12 | 12 | 12 | 12 | 12 | 12 | 11 | 11 | 11 | 11 | 11 |

Fig. 13d

| 18 | 18 | 18 | 18 | 18 | 22 | 22 | 22 | 22 | 22 | 28 | 28 | 28 | 28 | 29 |
|----|----|----|----|----|----|----|----|----|----|----|----|----|----|----|
| 18 | 18 | 18 | 18 | 18 | 22 | 22 | 22 | 22 | 22 | 28 | 28 | 28 | 28 | 28 |
| 18 | 18 | 18 | 18 | 18 | 22 | 22 | 22 | 22 | 22 | 27 | 28 | 28 | 28 | 28 |
| 18 | 18 | 18 | 18 | 18 | 22 | 22 | 22 | 22 | 22 | 27 | 27 | 28 | 28 | 28 |
| 18 | 18 | 18 | 18 | 18 | 22 | 22 | 22 | 22 | 22 | 27 | 27 | 27 | 28 | 28 |
| 18 | 18 | 18 | 18 | 18 | 21 | 21 | 21 | 21 | 21 | 22 | 22 | 22 | 22 | 22 |
| 18 | 18 | 18 | 18 | 18 | 21 | 21 | 21 | 21 | 22 | 22 | 22 | 22 | 22 | 22 |
| 18 | 18 | 18 | 18 | 18 | 21 | 21 | 21 | 21 | 22 | 22 | 22 | 22 | 22 | 22 |
| 18 | 18 | 18 | 18 | 19 | 21 | 21 | 21 | 21 | 22 | 22 | 22 | 22 | 22 | 22 |
| 18 | 18 | 18 | 18 | 19 | 20 | 21 | 21 | 21 | 22 | 22 | 22 | 22 | 22 | 22 |
| 18 | 18 | 18 | 18 | 19 | 19 | 19 | 18 | 18 | 18 | 18 | 18 | 18 | 18 | 18 |
| 18 | 18 | 18 | 18 | 18 | 18 | 18 | 18 | 18 | 18 | 18 | 18 | 18 | 18 | 18 |
| 17 | 18 | 18 | 18 | 18 | 18 | 18 | 18 | 18 | 18 | 18 | 18 | 18 | 18 | 18 |
| 17 | 17 | 18 | 18 | 18 | 18 | 18 | 18 | 18 | 18 | 18 | 18 | 18 | 18 | 18 |
| 17 | 17 | 17 | 18 | 18 | 18 | 18 | 18 | 18 | 18 | 18 | 18 | 18 | 18 | 18 |

Fig. 14a

|    | 0  | 1  | 2  | 3  | 4  | 5  | 6  | 7  | 8  | 9  | 10 | 11 | 12 | 13 | 14 |
|----|----|----|----|----|----|----|----|----|----|----|----|----|----|----|----|
| 0  | 0  | 1  | 1  | 1  | 1  | 8  | 8  | 9  | 9  | 9  | 10 | 11 | 11 | 11 | 11 |
| 1  | 1  | 1  | 1  | 1  | 1  | 8  | 8  | 9  | 9  | 9  | 9  | 11 | 11 | 11 | 11 |
| 2  | 1  | 1  | 1  | 1  | 2  | 8  | 8  | 9  | 9  | 9  | 9  | 11 | 11 | 11 | 11 |
| 3  | 1  | 1  | 1  | 2  | 2  | 8  | 8  | 8  | 8  | 8  | 8  | 12 | 12 | 12 | 12 |
| 4  | 1  | 1  | 2  | 2  | 2  | 8  | 8  | 8  | 8  | 8  | 8  | 12 | 12 | 12 | 12 |
| 5  | 8  | 8  | 8  | 8  | 8  | 2  | 2  | 2  | 1  | 1  | 29 | 29 | 29 | 29 |    |
| 6  | 8  | 8  | 8  | 8  | 8  | 2  | 2  | 1  | 1  | 1  | 29 | 29 | 29 | 29 |    |
| 7  | 9  | 9  | 9  | 8  | 8  | 2  | 1  | 1  | 1  | 1  | 29 | 29 | 29 | 29 |    |
| 8  | 9  | 9  | 9  | 8  | 8  | 1  | 1  | 1  | 1  | 1  | 29 | 29 | 29 | 29 |    |
| 9  | 9  | 9  | 9  | 8  | 8  | 1  | 1  | 1  | 1  | 1  | 29 | 29 | 29 | 29 |    |
| 10 | 10 | 10 | 9  | 9  | 8  | 8  | 1  | 1  | 1  | 1  | 0  | 29 | 29 | 29 | 29 |
| 11 | 11 | 11 | 11 | 11 | 12 | 12 | 29 | 29 | 29 | 29 | 29 | 29 | 29 | 29 | 29 |
| 12 | 12 | 11 | 11 | 11 | 12 | 12 | 29 | 29 | 29 | 29 | 29 | 29 | 29 | 29 | 29 |
| 13 | 13 | 11 | 11 | 11 | 12 | 12 | 29 | 29 | 29 | 29 | 29 | 29 | 29 | 29 | 29 |
| 14 | 14 | 11 | 11 | 11 | 12 | 12 | 29 | 29 | 29 | 29 | 29 | 29 | 29 | 29 | 29 |

Fig. 14b

| 15 | 16 | 17 | 18 | 19 | 20 | 21 | 22 | 23 | 24 | 25 | 26 | 27 | 28 | 29 |
|----|----|----|----|----|----|----|----|----|----|----|----|----|----|----|
| 18 | 18 | 18 | 19 | 19 | 20 | 21 | 21 | 22 | 22 | 29 | 29 | 29 | 29 | 29 |
| 18 | 18 | 18 | 19 | 19 | 20 | 21 | 21 | 22 | 22 | 29 | 29 | 29 | 29 | 29 |
| 18 | 18 | 18 | 19 | 19 | 20 | 21 | 21 | 22 | 22 | 29 | 29 | 29 | 29 | 29 |
| 18 | 18 | 18 | 19 | 19 | 20 | 21 | 21 | 22 | 22 | 29 | 29 | 29 | 29 | 29 |
| 18 | 18 | 18 | 19 | 19 | 20 | 21 | 21 | 22 | 22 | 29 | 29 | 29 | 29 | 29 |
| 22 | 22 | 22 | 21 | 21 | 20 | 19 | 19 | 18 | 18 | 12 | 12 | 12 | 12 | 12 |
| 22 | 22 | 22 | 21 | 21 | 20 | 19 | 19 | 18 | 18 | 12 | 12 | 12 | 12 | 12 |
| 22 | 22 | 22 | 21 | 21 | 20 | 19 | 19 | 18 | 18 | 11 | 11 | 11 | 11 | 11 |
| 22 | 22 | 22 | 21 | 21 | 20 | 19 | 19 | 18 | 18 | 11 | 11 | 11 | 11 | 11 |
| 22 | 22 | 22 | 21 | 21 | 20 | 19 | 19 | 18 | 18 | 11 | 11 | 11 | 11 | 11 |
| 22 | 22 | 22 | 21 | 21 | 20 | 19 | 19 | 18 | 18 | 11 | 11 | 11 | 11 | 11 |
| 22 | 22 | 22 | 21 | 21 | 20 | 19 | 19 | 18 | 18 | 11 | 11 | 11 | 11 | 11 |
| 22 | 22 | 22 | 21 | 21 | 20 | 19 | 19 | 18 | 18 | 11 | 11 | 11 | 11 | 11 |
| 22 | 22 | 22 | 21 | 21 | 20 | 19 | 19 | 18 | 18 | 11 | 11 | 11 | 11 | 11 |
| 22 | 22 | 22 | 21 | 21 | 20 | 19 | 19 | 18 | 18 | 11 | 11 | 11 | 11 | 11 |

Fig. 14c

| 15 | 16 | 17 | 18 | 19 | 20 | 21 | 22 | 23 | 24 | 25 | 26 | 27 | 28 | 29 |
|----|----|----|----|----|----|----|----|----|----|----|----|----|----|----|
| 18 | 18 | 18 | 19 | 19 | 20 | 21 | 21 | 22 | 22 | 29 | 29 | 29 | 29 | 29 |
| 18 | 18 | 18 | 19 | 19 | 20 | 21 | 21 | 22 | 22 | 29 | 29 | 29 | 29 | 29 |
| 18 | 18 | 18 | 19 | 19 | 20 | 21 | 21 | 22 | 22 | 29 | 29 | 29 | 29 | 29 |
| 18 | 18 | 18 | 19 | 19 | 20 | 21 | 21 | 22 | 22 | 29 | 29 | 29 | 29 | 29 |
| 18 | 18 | 18 | 19 | 19 | 20 | 21 | 21 | 22 | 22 | 29 | 29 | 29 | 29 | 29 |
| 22 | 22 | 22 | 21 | 21 | 20 | 19 | 19 | 18 | 18 | 12 | 12 | 12 | 12 | 12 |
| 22 | 22 | 22 | 21 | 21 | 20 | 19 | 19 | 18 | 18 | 12 | 12 | 12 | 12 | 12 |
| 22 | 22 | 22 | 21 | 21 | 20 | 19 | 19 | 18 | 18 | 11 | 11 | 11 | 11 | 11 |
| 22 | 22 | 22 | 21 | 21 | 20 | 19 | 19 | 18 | 18 | 11 | 11 | 11 | 11 | 11 |
| 22 | 22 | 22 | 21 | 21 | 20 | 19 | 19 | 18 | 18 | 11 | 11 | 11 | 11 | 11 |
| 22 | 22 | 22 | 21 | 21 | 20 | 19 | 19 | 18 | 18 | 11 | 11 | 11 | 11 | 11 |
| 22 | 22 | 22 | 21 | 21 | 20 | 19 | 19 | 18 | 18 | 11 | 11 | 11 | 11 | 11 |
| 22 | 22 | 22 | 21 | 21 | 20 | 19 | 19 | 18 | 18 | 11 | 11 | 11 | 11 | 11 |
| 22 | 22 | 22 | 21 | 21 | 20 | 19 | 19 | 18 | 18 | 11 | 11 | 11 | 11 | 11 |

Fig. 14d

| 18 | 18 | 18 | 19 | 19 | 20 | 21 | 21 | 22 | 22 | 29 | 29 | 29 | 29 | 29 |
|----|----|----|----|----|----|----|----|----|----|----|----|----|----|----|
| 18 | 18 | 18 | 19 | 19 | 20 | 21 | 21 | 22 | 22 | 29 | 29 | 29 | 29 | 29 |
| 18 | 18 | 18 | 19 | 19 | 20 | 21 | 21 | 22 | 22 | 29 | 29 | 29 | 29 | 29 |
| 18 | 18 | 18 | 19 | 19 | 20 | 21 | 21 | 22 | 22 | 29 | 29 | 29 | 29 | 29 |
| 18 | 18 | 19 | 19 | 19 | 20 | 21 | 21 | 22 | 22 | 29 | 29 | 29 | 29 | 29 |
| 18 | 19 | 19 | 19 | 19 | 20 | 21 | 21 | 22 | 22 | 22 | 22 | 22 | 22 | 22 |
| 19 | 19 | 19 | 19 | 19 | 20 | 21 | 21 | 21 | 22 | 22 | 22 | 22 | 22 | 22 |
| 19 | 19 | 19 | 19 | 19 | 20 | 21 | 21 | 21 | 21 | 21 | 21 | 21 | 21 | 21 |
| 19 | 19 | 19 | 19 | 19 | 20 | 21 | 21 | 21 | 21 | 21 | 21 | 21 | 21 | 21 |
| 20 | 20 | 20 | 20 | 20 | 20 | 20 | 20 | 20 | 20 | 20 | 20 | 20 | 20 | 20 |
| 21 | 21 | 21 | 21 | 21 | 20 | 19 | 19 | 19 | 19 | 19 | 19 | 19 | 19 | 19 |
| 21 | 21 | 21 | 21 | 21 | 20 | 19 | 19 | 19 | 19 | 19 | 19 | 19 | 19 | 19 |
| 21 | 21 | 21 | 21 | 21 | 20 | 19 | 19 | 19 | 19 | 18 | 18 | 18 | 18 | 18 |
| 22 | 21 | 21 | 21 | 21 | 20 | 19 | 19 | 19 | 19 | 18 | 18 | 18 | 18 | 18 |
| 22 | 22 | 22 | 21 | 21 | 20 | 19 | 19 | 19 | 18 | 18 | 18 | 18 | 18 | 18 |

Fig. 15a

| 0 | 1 | 2 | 3 | 4 | 5 | 6 | 7 | 8 | 9 | 10 | 11 | 12 | 13 | 14 |
|---|---|---|---|---|---|---|---|---|---|----|----|----|----|----|
| 10 | 9 | 8 | 7 | 6 | 5 | 4 | 3 | 2 | 1 | 0 | 29 | 28 | 27 | 26 |

Fig. 15b

| 15 | 16 | 17 | 18 | 19 | 20 | 21 | 22 | 23 | 24 | 25 | 26 | 27 | 28 | 29 |
|----|----|----|----|----|----|----|----|----|----|----|----|----|----|----|
| 25 | 24 | 23 | 22 | 21 | 20 | 19 | 18 | 17 | 16 | 15 | 14 | 13 | 12 | 11 |

Fig. 14

| Fig. 14a | Fig. 14c |
|----------|----------|
| Fig. 14b | Fig. 14d |

Fig. 13

| Fig. 13a | Fig. 13c |
|----------|----------|
| Fig. 13b | Fig. 13d |

Fig. 12

| Fig. 12a | Fig. 12c |
|----------|----------|
| Fig. 12b | Fig. 12d |

Fig. 15

| Fig. 15a |
|----------|
| Fig. 15b |

…

TEST PATTERN GENERATION DEVICE

BACKGROUND OF THE DISCLOSURE

1. Field of the Invention

The present invention relates to a test pattern generation device for a digital circuit.

2. Description of the Prior Art

ASIC semiconductors with a circuit construction which makes it possible to monitor the state of all circuit elements have become the preferred type of test pattern generation device. Testing by a semiconductor with this type of construction detects circuit shorts and breaks and other types of semiconductor defects by switching the state of circuit elements ON and OFF and measuring the result according to the test sequence.

A conventional logic element is described, for example, in *Design automation reference* 49-12, research seminar, *Information Processing Society of Japan*. According to the prior art test pattern generation devices, the test patterns are generated by the simulation operation using the real number instead of the logic values. The logic values used in the conventional test pattern generation devices are shown in FIG. 8. The logic value is expressed sequentially increasing from logic 0 through logic X to logic 1.

Using a conventional logic value shown in FIG. 8, more information can be obtained about the logic states in the circuit. For example, in the AND gate shown in FIGS. 11a and 11b, the outputs of FIGS. 11a and 11b would both be 0 when the inputs are either (0,0) or (0,1). When the logic state is expressed as a continuous value between logic 0 and logic 1, the logic state of the output section will be a value closer to logic 1 with the case of FIG. 11b than with the case of FIG. 11a. By the use of the continuous value instead of the discrete value, information concerning the logic states of the input section can be obtained from the logic state of the output section. Thus, it is possible to know in which direction the output is easily shifted when the input is varied by just investigating the logic state of the output section, and this can be used to facilitate troubleshooting.

However, according to the prior art test pattern generation device that uses the continuous logic value of FIG. 8, it is not possible to express a definite logic state between logic 0 and logic 1 in the input section and the output section because the logic X expressing an unknown value is positioned midway between logic 0 and logic 1.

SUMMARY OF THE INVENTION

The present invention has been developed with a view to substantially solving the above described disadvantages and has for its essential object to provide an improved test pattern generation device.

In order to achieve the aforementioned object, a test pattern generation device which produces test pattern signals for testing a preselected digital circuit, according to the present invention, comprises means for producing a dominant pattern signal in a binary form; means for producing a set of subservient pattern signals each in a binary form and being unit Hamming distance from said dominant pattern signal; means for simulating an operation of said preselected digital circuit, in response to each subservient pattern signal; means for producing, from the result of the simulation operation, a controllability cost $CCO_f$ at a preselected line $G_f$ in said digital circuit for each subservient pattern signal; means for producing, from the result of the simulation operation, a continuous cyclic logic value $CV_f$ at said preselected line $G_f$ for each subservient pattern signal; means for producing an evaluation cost $CT_f$ for each line by the use of said controllability cost $CCO_f$ and said continuous cyclic logic value $CV_f$ for each subservient pattern signal; means for selecting from said set of subservient pattern signals a subservient pattern signal that produced a minimum evaluation cost $CT_f$; and test pattern memory means for storing said selected subservient pattern signal as one test pattern and assigning said selected subservient pattern signal as a next dominant pattern signal in a next cycle operation.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIGS. 11a and 11b are logic elements showing relationship between inputs and output;

FIGS. 11c and 11d are logic elements showing controllability costs $CCO_i$, $CC1_i$, $CCP_i$ and $CCN_i$ at the output of each element;

FIGS. 12a, 12b, 12c and 12d taken together as shown in FIG. 12 shows a table for obtaining the continuous cyclic logic values $CV_i$ for an AND gate;

FIGS. 13a, 13b, 13c and 13d taken together as shown in FIG. 13 shows a table for obtaining the continuous cyclic logic values $CV_i$ for an OR gate;

FIGS. 14a, 14b, 14c and 14d taken together as shown in FIG. 14 shows a table for obtaining the continuous cyclic logic values $CV_i$ for an EX-OR gate; and FIGS. 15a and 15b taken together as shown in FIG. 15 shows a table for obtaining the continuous cyclic logic values $CV_i$ for an invertor, which is a logic NOT.

DETAILED DESCRIPTION OF THE PREFERRED EMBODIMENTS

Figure 1:
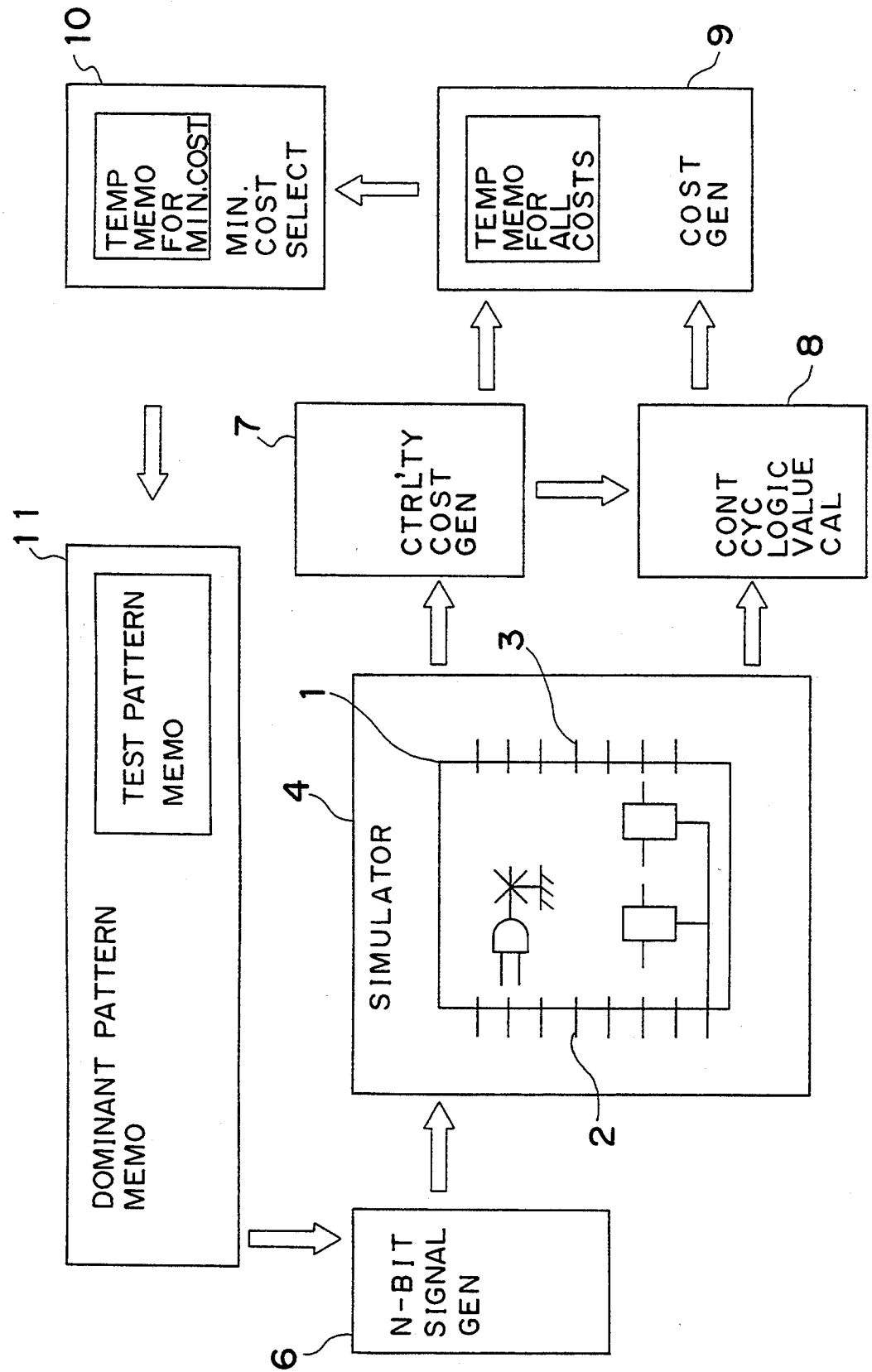
FIG. 1 is a block diagram of a test pattern generation device of the present invention.

Referring to FIG. 1, a test pattern generation device according to the present invention is shown. The test pattern generation device comprises a simulator 4 in which a sequential circuit 1 to be tested is created in terms of software.

The sequential circuit 1 includes various logic elements such as, AND, OR, EXCLUSIVE OR and NOT elements, and also memory devices such as, FF (flip-flops), and has N inputs 2 and M outputs 3. The N inputs 2 sequentially receive N-bit signals from an N-bit signal generator 6.

The N-bit signal generator 6 receives a dominant pattern from a dominant pattern memory 11 and generates N different subservient patterns of N-bit signals based on the received dominant pattern, and applies the subservient pattern signals to inputs 2. For example, when N=5, the dominant pattern signal may be (0,0,0,0,0), and five subservient pattern signals would be (1,0,0,0,0), (0,1,0,0,0), (0,0,1,0,0), (0,0,0,1,0) and (0,0,0,0,1). Note that the difference between the dominant pattern signal and each of the subservient pattern signals is equal to unit Hamming distance, meaning that only one bit is changed therebetween. As will be described later, after one cycle operation, that is, after N patterns of N-bit signals are produced, one subservient pattern signal is selected and is used as a dominant pattern signal in the next cycle operation.

It is to be noted here that instead of N different patterns, the signal generator 6 may produce L different patterns (L<N) selected randomly with the pins used more often are weighted greater.

The test pattern generation device further comprises a controllability cost generator 7, a continuous cyclic logic value calculator 8, a cost generator 9, a minimum cost selector 10, and a dominant pattern memory/ 11, each is described in detail below.

The continuous cyclic logic value calculator 8 calculates a continuous cyclic logic value $CV_i$ (subscript i represents a line in the sequential circuit 1) for each line in the sequential circuit 1 after one subservient pattern signal is inputted to inputs 2.

Figure 2:
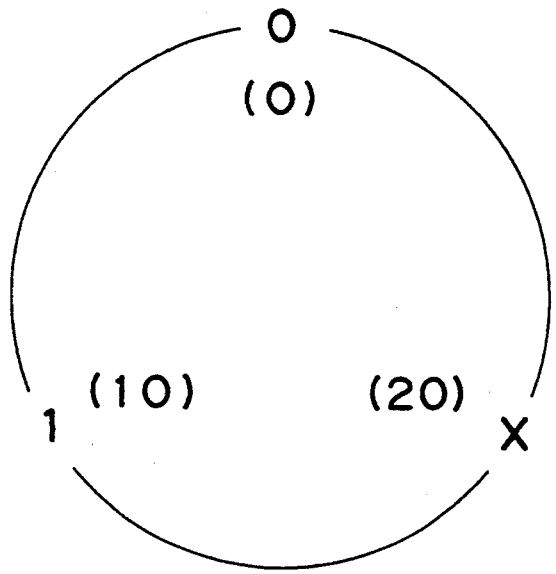
FIG. 2 is a diagram showing a continuous cyclic logic value employed in the present invention.

Referring to FIG. 2, a diagram of the continuous cyclic logic value $CV_i$ is shown. Before explaining the logic value $CV_i$, a logic operation of an AND gate is considered. As shown in FIGS. 11a and 11b, an AND gate produces logic "0" when inputs thereto is either (0,0) or (0,1). If the output of the AND gate is to be changed to logic "1", two input signals should be changed from "0" to "1" for the case of FIG. 11a, but for the case of FIG. 11b, only one input signal should be changed from "0" to "1". Therefore, the logic "0" produced from the AND gate of FIG. 11b can be said closer to logic "1" than the logic "0" produced from the AND gate of FIG. 11a. To distinguish between these two logic "0s" produced from the AND gates in FIGS. 11a and 11b, the logic "0" of FIG. 11a is referred to as a discrete logic "0", and the logic "0" of FIG. 11b is referred to as an intermediate logic "0", and in the present invention, the continuous cyclic logic value $CV_i$ is introduced that can indicate the intermediate levels between the discrete logic values "0", "1" and "unknown". ("Unknown X" is used to indicate that it can be either "1" or "0" as often used as a logic value represent the output of a flip-flop.) In other words, by the use of the continuous cyclic logic value, it is possible to indicate, in the case of an AND gate, that the output of the AND gate obtained by the input (1,0) is closer to discrete logic "1" than the output obtained by the input (0,0).

As shown in FIG. 2, the continuous cyclic logic value $CV_i$ takes a value between 0 and 30, in which 0 represents discrete logic "0", 10 represents discrete logic "1" and 20 represents discrete logic "unknown X". The logic values between 0 and 10, between 10 and 20 and between 20 and 30(=0), are values indicating the intermediate levels. FIGS. 12a, 12b, 12c and 12d taken together shows an example of a table for obtaining the continuous cyclic logic values $CV_i$ of an output of an AND gate in which the top row indicates the continuous cyclic logic value $CV_i$ of the first input to the AND gate and the left column indicates the continuous cyclic logic values $CV_i$ of the second input to the AND gate.

Similarly, FIGS. 13a, 13b, 13c and 13d taken together shows an example of a table for obtaining the continuous cyclic logic values $CV_i$ for an OR gate, FIGS. 14a, 14b, 14c and 14d taken together shows an example of a table for obtaining the continuous cyclic logic values $CV_i$ for an EX-OR gate, and FIGS. 15a and 15b taken together shows an example of a table for obtaining the continuous cyclic logic values $CV_i$ for an invertor, which is a logic NOT.

For calculating the continuous cyclic logic values $CV_i$ of a flip-flop, the following formula may be used.

$$\begin{aligned} CV_i &= \text{dff (set, reset, data, clock\_b, clock\_n, q\_b)} \\ &= |\text{line} - \text{line1}| * \text{dff(i1)}/10 + |\text{line} - \text{line2}| * \text{dff(i2)}/10 \end{aligned}$$

wherein six parameters (set, reset, data, clock\_b, clock\_n and q\_b) represent signals applied to these terminals, and the suffixed symbol \_n indicate the present cycle signal, and \_b indicate the previous cycle signal. More, specifically, i1 is the first nearest discrete logic value set from six parameters (set, reset, data, clock\_b, clock\_n, q\_b), i2 is the second nearest discrete logic value set from six parameters (set, reset, data, clock\_b, clock\_n, q\_b). It is noted that the function dff produces, when the input parameters are all expressed by the discrete logic values, a discrete logic value. The continuous cyclic logic value is obtained by finding the discrete logic value sets i1 and i2. The discrete logic value sets i1 and i2 are given by the following formulas:

$$\begin{aligned} i1 = \{&\text{set1, reset1, data1, clock\_b1, clock\_n1, q\_b1}| \\ &\min d(\{\text{set, reset, data, clock\_b, clock\_n, q\_b}\}, \\ &\{\text{set1, reset1, data1, clock\_b1, clock\_n1, q\_b1}\}) \\ &(\text{set1, reset1, data1, clock\_b1, clock\_n1, q\_b1} \in \\ &\{0, 10, 20\})\} \end{aligned}$$

$$\begin{aligned} i2 = \{&\text{set2, reset2, data2, clock\_b2, clock\_n2, q\_b2}| \\ &\min d(\{\text{set, reset, data, clock\_b, clock\_n, q\_b}\}, \\ &\{\text{set2, reset2, data2, clock\_b2, clock\_n2, q\_b2}\}) \\ &(\text{set2, reset2, data2, clock\_b2, clock\_n2, q\_b2} \in \\ &\{0, 10, 20\}, \{\text{set2, reset2, data2, clock\_b2,} \\ &\text{clock\_n2, q\_b2}\} \neq i1)\} \end{aligned}$$

wherein function d produces an Euclid distance between the two inputs. A linear compensation 11 represents the input value of the function dff, the value of i1 and the value of i2 at an input terminal, in the case where the i1 and i2 take different values, and which can be given by the following formula.

```
11  =  {line, line1, line2, | line1≠line2
       ({line, line1, line2,}={set, set1, set2}, {reset,
       reset1, reset2}, {data, data1, data2,}, {clock_b,
       clock_b1, clock_b2},
       {clock_n, clock_n1, clock_n2},
       {q_b, q_b1, q_b2})}
```

The continuous cyclic logic values $CV_i$ given in the tables and the above formulas are merely as an example. Other tables or calculation formulas may be used, such as disclosed in "A SEQUENTIAL CIRCUIT TEST GENERATOR USING THRESHOLD-VALUE SIMULATION" by Cheng et al in 0731-3071/88/0000/0024S01.00 1988 IEEE, in which the decimal fraction figures are used.

Figure 3:
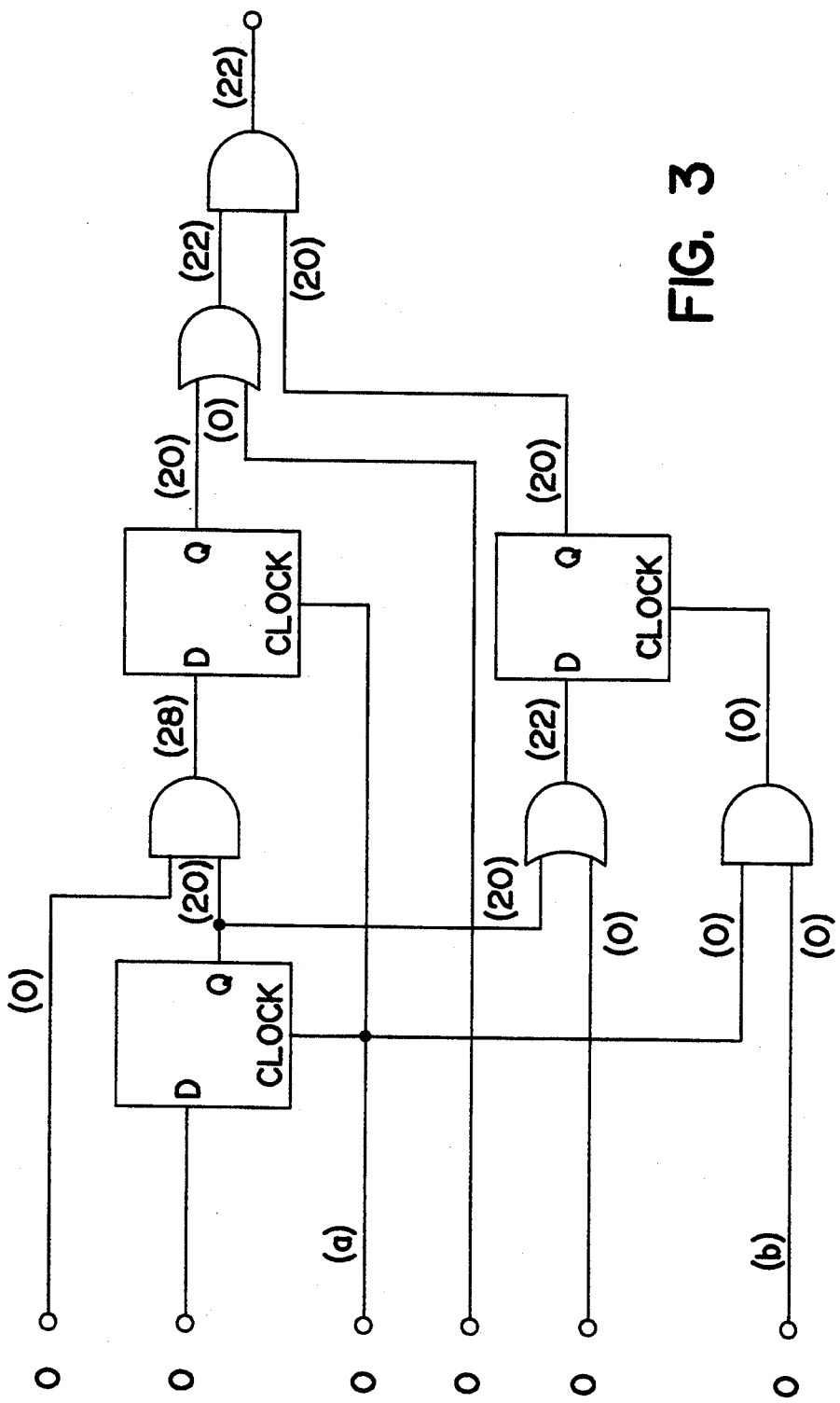
FIG. 3 is a circuit diagram of one test circuit used for explaining the present invention.

Using the table presented in the drawings, the continuous cyclic logic values $CV_i$ of a circuit shown in FIG. 3 is now considered. Assuming that all six inputs are constituted by discrete logic "0", the number given in parentheses over each line indicate the continuous cyclic logic values $CV_i$. For the simplicity, the continuous cyclic logic values $CV_i$ at the Q output of the flip-flops are chosen to be 20.

Instead of using the table, it is possible to obtain the continuous cyclic logic values $CV_i$ by a neural network, which will be described later in connection with FIGS. 9 and 10.

The controllability cost generator 7 produces various kinds of controllability costs $CCO_i$, $CCl_i$, $CCP_i$, and $CCN_i$ at the output of each element (input terminal, AND, OR, EX-OR, NOT, FF) after one signal pattern is inputted to inputs 2. Generally, the controllability cost is the number of steps necessary to change the output of an element from the present condition to another condition. The controllability cost $CCO_i$ represents the number of steps necessary to change the present output condition to "0". The controllability cost $CCl_i$ represents the number of steps necessary to change the present output condition to "1". The controllability cost $CCP_i$ represents the number of steps necessary to change the present output conditions first to "0" and then to "1". The controllability cost $CCN_i$ represents the number of steps necessary to change the present output condition first to "1" and then to "0".

For example, the controllability costs of an OR gate having two inputs, as shown in FIG. 11c, are considered. It is assumed that the OR gate is receiving (0,0). In this case, the present output condition of the OR gate is (0), which is expressed by $V_i^o=0$ (superscript o indicates output). Under this condition, the controllability cost $CCl_i=1$ is obtained at the output of the OR gate, because the inputs must be changed in one step: $(0,0) \rightarrow (0,1)$ to obtain (1) at the output of the OR gate. When the controllability cost $CCl_i=1$ is obtained at the output of the OR gate, it is so stated that the output line of the OR gate is charged with $CCl_i=1$. Under the same condition, the controllability cost $CCO_i=0$ is obtained, meaning no change step is necessary in the two inputs to change the output of the OR gate to "0". In this case, it is so stated that the output line of the OR gate is charge with $CCO_i=0$. Similarly, under the same condition, the output line of the OR gate is charge with $CCP_i=1$, and $CCN_i=2$. In other words, under the above condition, the output line of the OR gate is charged with the controllability costs $CCO_i=0$, $CCl_i=1$, $CCP_i=1$, and $CCN_i=2$, simultaneously. The charged costs may change when the input condition is changed.

As another example, the controllability costs of a logic circuit having two OR gates one AND gate, as shown in FIG. 11d are considered. It is assumed that the both OR gates are receiving (0,0). In this case, the present output condition of the AND gate is (0), which is expressed by $V_i^o=0$. Under this condition, the controllability cost $CCl_i^o$ (superscript o indicates ouput) for the output of the AND gate is calculated by adding the cost $CCl_i^i=1$ (superscript i indicates input) charged on each input line of the AND gate, thus obtaining $CCl_i^o=2$.

The formulas for obtaining the controllability costs $CCO_iCCl_i$, $CCP_i$ and $CCN_i$ for various elements are given below.

For all elements:
$CCO_i^o = 0$      $(V_i^o = 0)$
$CCl_i^o = 0$      $(V_i^o = 1)$ For all lines:
$CCO_i^o = 1$      $(V_i^o = 1, X)$
$CCl_i^o = 1$      $(V_i^o = 0, X)$ For an AND gate:

$CCO_i^o = \min_{1 \leq i \leq n} (CCO_i^j)$      $(V_i^o = 1, X)$ $CCl_i^o = \sum_{i=1}^{n} (CCl_i^j)$      $(V_i^o = 0, X)$ $CCP_i^o = \min_{1 \leq i \leq n} \left( CCP_i^j + \sum_{j=1, j \neq i}^{n} CCl_i^j \right)$      $(V_i^o = 0, X)$ $CCP_i^o = \min_{1 \leq i \leq n} (CCP_i^j)$      $(V_i^o = 1)$ $CCN_i^o = \min_{1 \leq i \leq n} \left( CCN_i^j + \sum_{j=1, j \neq i}^{n} CCl_i^j \right)$      $(V_i^o = 0, X)$ $CCN_i^o = \min_{1 \leq i \leq n} (CCN_i^j)$      $(V_i^o = 1)$ For an OR gate:

$CCO_i^o = \sum_{i=1}^{n} (CCO_i^j)$      $(V_i^o = 1, X)$ $CCl_i^o = \min_{1 \leq i \leq n} (CCl_i^j)$      $(V_i^o = 0, X)$ $CCP_i^o = \min_{1 \leq i \leq n} (CCP_i^j)$      $(V_i^o = 0)$ $CCP_i^o = \min_{1 \leq i \leq n} \left( CCP_i^j + \sum_{j=1, j \neq i}^{n} CCO_i^j \right)$      $(V_i^o = 1, X)$ $CCN_i^o = \min_{1 \leq i \leq n} (CCN_i^j)$      $(V_i^o = 0)$ $CCN_i^o = \min_{1 \leq i \leq n} \left( CCN_i^j + \sum_{j=1, j \neq i}^{n} CCO_i^j \right)$      $(V_i^o = 1, X)$ -continued For an EXCLUSIVE OR gate (with two terminals)

$CC0_i^p = \min (CC0_i^1 + CC0_i^2, CC1_i^1 + CC1_i^2)$  $(V_i^p = 1, X)$
$CC1_i^p = \min (CC0_i^1 + CC1_i^2, CC1_i^1 + CC0_i^2)$  $(V_i^p = 0, X)$
$CCP_i^p = \min (CC0_i^1 + CCP_i^2, CC0_i^2 + CCP_i^1,$
$CC1_i^1 + CCN_i^2, CC1_i^2 + CCN_i^1)$
$CCN_i^p = \min (CC1_i^1 + CCP_i^2, CC1_i^2 + CCP_i^1,$
$CC0_i^1 + CCN_i^2, CC0_i^2 + CCN_i^1)$ For a D flip-flop $CC0_i^p = CC0_i^{set} + \min$  $(V_i^p = 1, X)$
$(CC1_i^{reset}, CC0_i^{data} + CCP_i^{clock})$
$CC1_i^p = CC0_i^{reset} + \min$  $(V_i^p = 0, X)$
$(CC1_i^{set}, CC1_i^{data} + CCP_i^{clock})$
$CCP_i^p = CC1_i^p$  $(V_i^p = 0)$
$CCP_i^p = CC0_i^p + CC1_i^p$  $(V_i^o = 1, X)$
$CCN_i^p = CC1_i^p + CC0_i^p$  $(V_i^p = 0, X)$
$CCN_i^p = CC0_i^p$  $(V_i^p = 1)$ The cost generator 9 receives, after the application of each subservient pattern signal, the controllability cost $CC0_f$ of a test line $G_f$, if the test line $G_f$ is presumed to have a stuck-at 1 fault, i.e., a fault wherein the line continuously produces "1" without any change. On the other hand, the cost generator 9 receives the controllability cost $CC1_f$ of a test line $G_f$, if the test line $G_f$ is presumed to have a stuck-at 0 fault, i.e., a fault wherein the line continuously produces "0" without any change. In general, if "S" and "T" are defined as opposite logic values, the cost generator 9 receives the controllability cost $CCT_f$ of a test line $G_f$, if the test line $G_f$ is presumed to have a stuck-at S fault, i.e., a fault wherein the line continuously produces "S" without any change.

Furthermore, the cost generator 9 also receives the continuous cyclic logic value $CV_f$ of the test line $G_f$.

In the cost generator 9, a difference $CCV_f$ between the continuous cyclic logic value $CV_f$ and a desired continuous cyclic logic value $DCV_f$ of the test line $G_f$ is calculated. Here, the desired continuous cyclic logic value $DCV_f$ would be equal to 0 if the line $G_f$ should have logic "0", that is when the test line $G_f$ is presumed to have a stuck-at 1 fault, and be equal to 10 if the line $G_f$ should have logic "1", that is when the test line $G_f$ is presumed to have a stuck-at 0 fault.

Then, in the cost generator 9, the controllability cost $CCT_f$ multiplied by a predetermined constant K1 and the difference $CCV_f$ multiplied by a predetermined constant K2 are added to obtain an evaluation cost $CT_f$ of the test line $G_f$. Thus, in the cost generator 9, after the application of each dominant or subservient pattern signal, the following calculation is carried out.

$$CT_f = K1 \times CCT_f + K2 \times CCV_f$$

The minimum cost selector 10 stores the evaluation cost $CT_f$ for each subservient pattern signal, and selects the minimum evaluation cost $CT_f$ in each cycle operation.

The dominant pattern memory 11 receives the minimum evaluation cost $CT_f$ and compares the minimum evaluation cost $CT_f$ obtained in the present cycle operation and that obtained in the previous cycle operation.

If the minimum evaluation cost $CT_f$ obtained in the present cycle operation is smaller, the pattern signal used in the present cycle operation to produce the minimum evaluation cost $CT_f$ is stored as one test pattern.

If the minimum evaluation cost $CT_f$ obtained in the present cycle operation is equal to or greater than that obtained in one previous cycle operation, the dominant pattern used in one previous cycle operation is modified by changing an input representing the clock to the opposite logic, and the modified pattern is stored as one test pattern.

Here, as shown in FIG. 3, an input representing the clock can be an input (a) which is directly applied to the clock terminal of a flip-flop, or an input (b) which is indirectly applied to the clock terminal of a flip-flop. If there are more than one inputs representing the clock, only one input is selected randomly.

The test pattern just stored in the dominant pattern memory 11 is applied to the N-bit signal generator 6 which uses the received test pattern as a dominant pattern for the next cycle operation.

The dominant pattern memory 11 continues to store the test patterns until the obtained minimum evaluation cost $CT_f$ becomes smaller than 10, which is equal to a logic value difference between two discrete logic values, such as between discrete logic "0" and discrete logic "1". When the evaluation cost $CT_f$ becomes smaller than 10, the controllability cost $CCT_f$ will become nearly equal to 0, and therefore, the difference $CCV_f$ will become nearly equal to 3.3 (note that K2=3). Thus when the evaluation cost $CT_f$ becomes smaller than 10, it is understood that the continuous cyclic logic value $CV_f$ has approached very close to the desired continuous cyclic logic value $DCV_f$ of the test line $G_f$.

For testing the actual sequential circuit which has the same design as the simulated circuit, the test patterns stored in the dominant pattern memory 11 are sequentially applied to the actual sequential circuit, while observing the test line $G_f$. If the logic signal at the test line $G_f$ changes after the sequential application of all the test patterns, it is understood that the tested sequential circuit is operating properly. On the other hand, if the logic signal at the test line $G_f$ did not change, it is understood that there is a fault in the tested sequential circuit somewhere at a stage before the test line $G_f$.

Now, the operation of the test pattern generation device of the present invention is described with reference to FIGS. 4a, 4b, 5 and 6. It is assumed that the sequential circuit to be tested is the circuit shown in FIG. 5, and the line $G_f$ to be tested is the line $G_{17}$. It is hypothetically set that a stuck-at 1 fault is observed at line $G_{17}$, so that the line $G_{17}$ continuously produces "1" without any change. Also for the calculation in the cost generator 9, constants are so set that, K1=1 and K2=3.

Figure 4A:
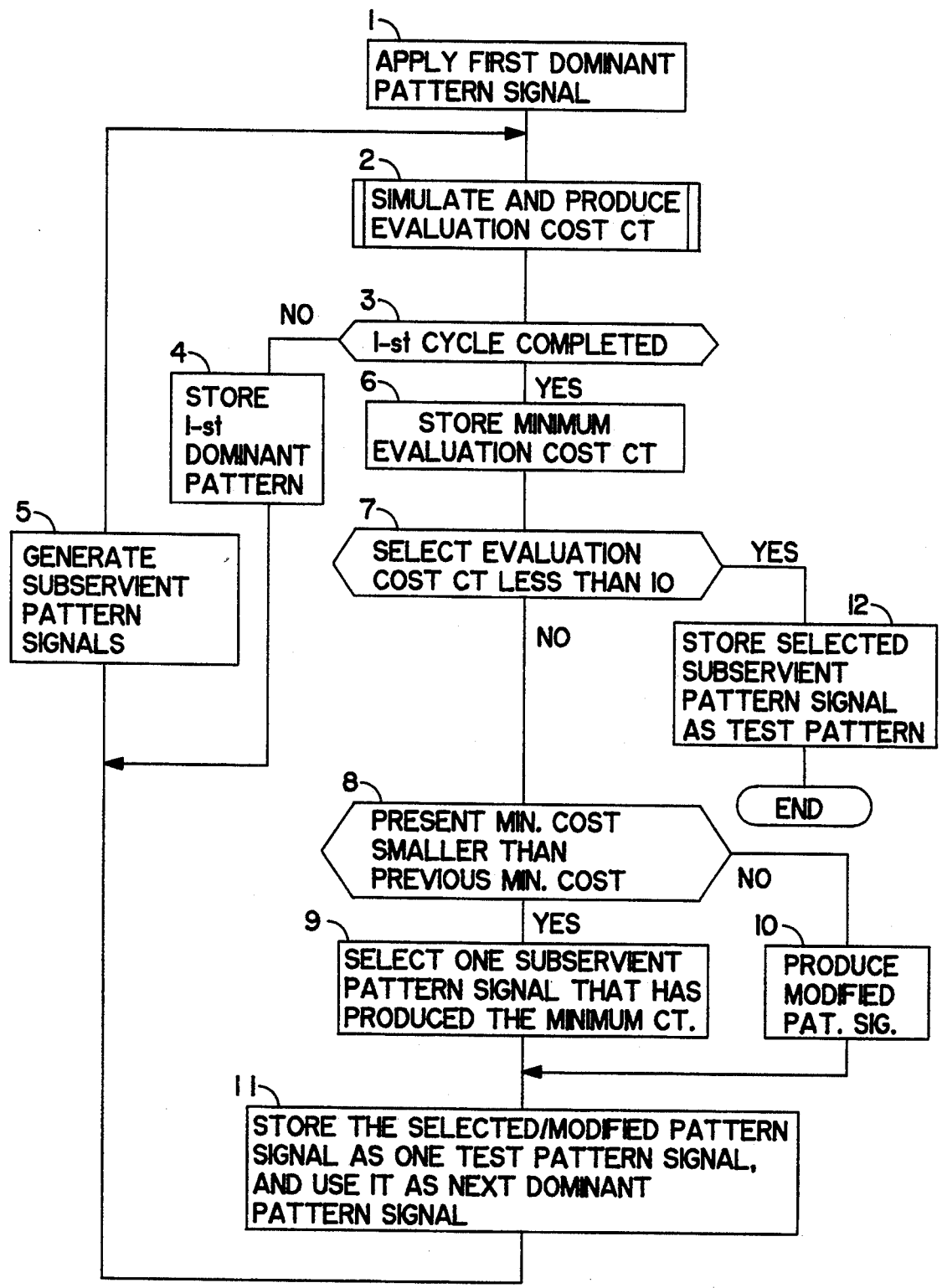
FIGS. 4a and 4b are flow charts showing the operation of the test pattern generation device of the present invention.

As shown in FIG. 4a, in step #1, pattern generation device according to the present invention is initialized so that dominant pattern memory 11 provides a first dominant pattern signal (0,0,0,0,0) to the N-bit signal generator 6.

In step #2, the simulation of the circuit operation is carried out using the first dominant pattern signal.

Figure 4B:
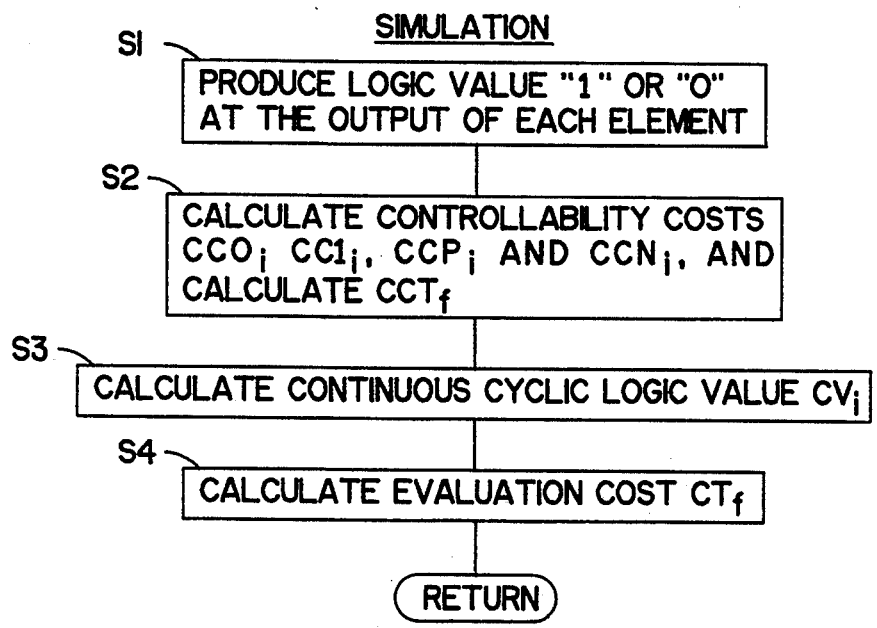

The detail of step #2 is shown in FIG. 4b. In step S1, logic value "1", "0" or "X" is at the output of each element.

In step S2, the controllability costs $CC0_i$, $CC1_i$, $CCP_i$ and $CCN_i$ at the output of each element are calculated.

In step S3, the continuous cyclic logic value $CV_i$ at the output of each element is calculated.

In step S4, by the use of $CC0_{17}$, $CCV_{17}$, the following calculation is carried out:

$$CT_{17} = 1 \times CC0_{17} + 3 \times CCV_{17}$$

Figure 6:
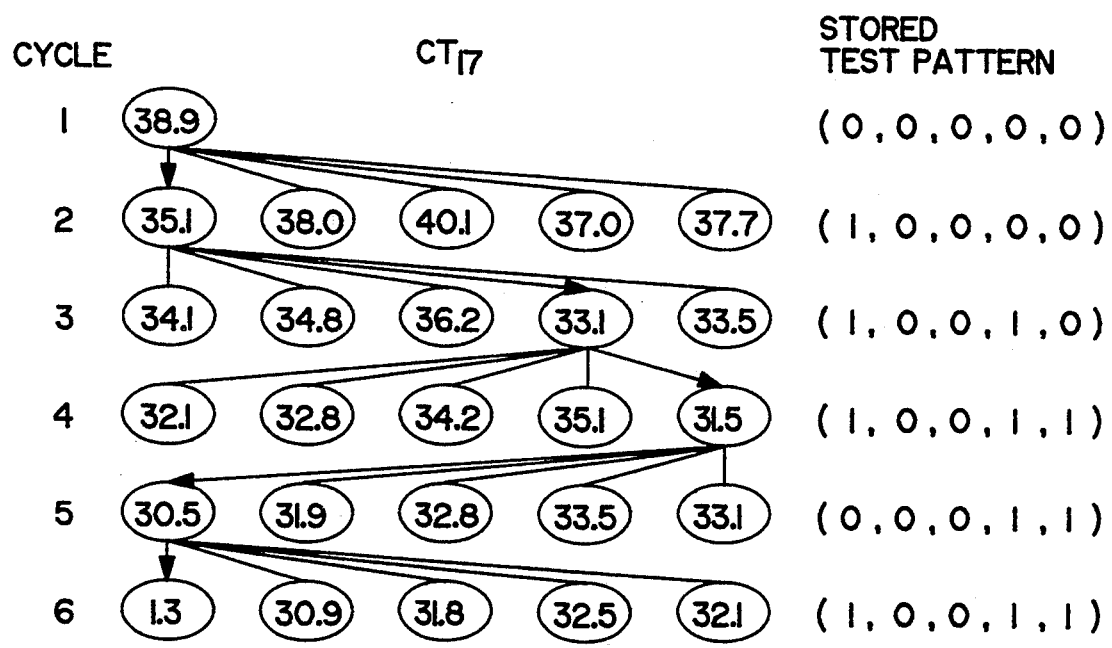
FIG. 6 is a diagram showing the results obtained after each operation cycle.

The cost generator 9 produces the evaluation cost $CT_{17}$ for the first dominant signal, which is temporarily stored in the cost generator 9. As an example, it is assumed that the evaluation cost $CT_{17}$ for the first dominant pattern signal (0,0,0,0,0) is such that $CT_{17}=38.9$, as shown in FIG. 6.

Returning back to the main routine of FIG. 4a, in step #3, it is detected whether or not the subservient patterns for the first dominant pattern have been produced. At this moment, since no subservient patterns are produced for the first dominant pattern, the program goes to step #4.

At step #4, the evaluation cost $CT_{17}=38.9$ for the first dominant pattern signal is temporarily stored in the minimum cost selector 10 and, at the same time, the first dominant pattern signal is stored as the first test pattern in the test pattern memory in the dominant pattern memory 11.

At step #5, based on the presently selected dominant pattern signal, which is (0,0,0,0,0) in the present situation, the N-bit signal generator 6 generates the five subservient patten signals (1,0,0,0,0), (0,1,0,0,0), (0,0,1,0,0), (0,0,0,1,0) and (0,0,0,0,1), each of which is unit Hamming distance from the selected dominant pattern signal. Then, the program returns to step #2.

At step #2, the first, second, third, fourth and fifth subservient pattern signals are used sequentially to simulate the circuit operation to produce the evaluation costs $CT_{17}$ for these five subservient pattern signals. It is assumed that the produced evaluation costs $CT_{17}$ for the first, second, third, fourth and fifth subservient pattern signals are 35.1, 38.0, 40.1, 37,0 and 37.7, respectively, as indicated in FIG. 6. The produced evaluation costs $CT_{17}$ for the five subservient pattern signals are temporarily stored in the cost generator 9.

Then, at step #6, the minimum cost selector 10 selects the minimum of the five evaluation costs temporarily stored in the cost generator 9. In the above example, $CT_{17}=35.1$ is selected.

At step #7, it is detected whether the selected evaluation cost $CT_{17}$ is less than 10, or not. If yes, the program goes to step #12, so that the subservient pattern signal that has produced the selected evaluation cost $CT_{17}$ is stored in the test pattern memory and, then, the operation ends. If no, the program advances to step #8.

At step #8, the selected minimum evaluation cost $CT_{17}$ is compared with the previous evaluation cost temporarily stored in the minimum cost selector 10, which is in the present situation 38.9 for the first dominant pattern signal.

If the minimum evaluation cost selected in the present cycle is less than that selected in the previous cycle, the program goes to step #9 at which the subservient pattern signal that has produced the minimum evaluation cost is selected.

If the minimum evaluation cost selected in the present cycle is not less than that selected in the previous cycle the program goes to step #10 at which a modified pattern signal is produced. The modified pattern signal is based on the present dominant pattern signal with one clock bit being changed to opposite logic signal.

Then, at step #11, the pattern signal as selected in step #9 or the modified pattern signal obtained in step #10 is stored in the test pattern memory, and used the same as the next dominant pattern signal.

In the above example, the first subservient pattern signal (1,0,0,0,0) has produced the minimum evaluation cost $CT_{17}=35.1$, and therefore, the subservient pattern signal (1,0,0,0,0) is selected as the next dominant pattern signal, and is stored as the second test pattern signal in the dominant pattern memory 11.

When the operation in step #11 completes, one cycle operation is completed, and the third cycle operation starts from step #5.

Then, in step #6, the N-bit signal generator 5 generates, based on the present dominant pattern (1,0,0,0,0), five subservient pattern signals (0,0,0,0,0), (1,1,0,0,0), (1,0,1,0,0) (1,0,0,1,0) and (1,0,0,0,1) and in step #2, five evaluation costs $CT_{17}$, which are 34.1, 34.8, 36.2, 33.1 and 33.5, respectively, as shown in FIG. 6, are produced.

At step #6, at this stage, since the fourth subservient pattern signal (1,0,0,1,0) has produced the minimum evaluation cost $CT_{17}=33.1$, the subservient pattern signal (1,0,0,1,0) is selected as the next dominant pattern signal, and is stored as the third test pattern signal in the dominant pattern memory 11.

Then, in the fourth cycle operation, using the pattern signal (1,0,0,1,0) as a dominant pattern signal, the sequential circuit operation is simulated five times using five subservient pattern signals (0,0,0,1,0), (1,1,0,1,0), (1,0,1,1,0), (1,0,0,0,0) and (1,0,0,1,1) to produce five evaluation costs $CT_{17}$, which are 32.1, 32.8, 34.2, 35.1 and 31.5, respectively, as shown in FIG. 6. Then, the last subservient pattern signal (1,0,0,1,1), with which the minimum evaluation cost $CT_{17}=31.5$ is produced, is selected as the next dominant pattern signal, and is stored as the fourth test pattern signal in the dominant pattern memory 11.

In a similar manner, in the fifth cycle operation, the first subservient pattern signal (0,0,0,1,1), with which the minimum evaluation cost $CT_{17}=30.5$ is produced, is selected as the next dominant pattern signal, and is stored as the fifth test pattern signal in the dominant pattern memory 11.

Then, in the sixth cycle operation, it is detected that the first subservient pattern signal (1,0,0,1,1) has the minimum evaluation cost $CT_{17}=1.3$, and that this evaluation cost is less than 10. Thus, at step #12, the pattern signal (1,0,0,1,1) just used is stored as the final test pattern signal in the dominant pattern memory 11, and the operation ends to obtain one set of test pattern signals: (0,0,0,0,0), (1,0,0,0,0), (1,0,0,1,0), (1,0,0,1,1), (0,0,0,1,1) and (1,0,0,1,1).

Figure 5:
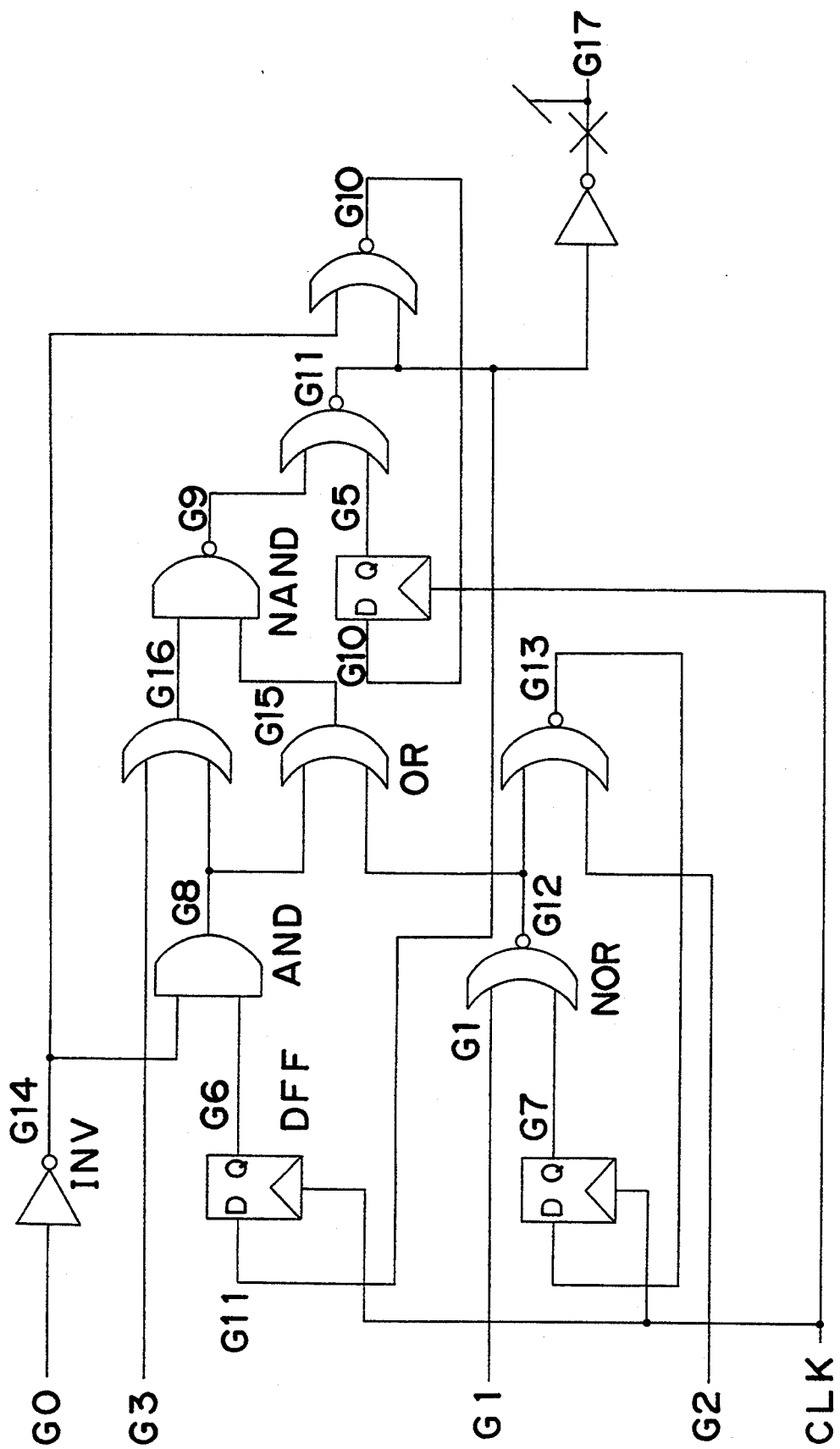
FIG. 5 is a circuit diagram of one test circuit used for explaining the present invention.

The obtained set of test pattern signals is used for testing an actually produced sequential circuit of FIG. 5. In the test, the output from line $G_{17}$ is observed by a suitable tester, while six test pattern signals are applied sequentially. After the application of the six test pattern signals, if the output from line $G_{17}$ showed "0", it is understood that the circuit is operating properly. However, if the output from line $G_{17}$ showed "1" after the application of six test pattern signals, it is understood that there is a fault in the circuit somewhere before the line $G_{17}$.

In the above operation, if all of the evaluation costs $CT_{17}$ of the five subservient pattern signals showed greater than the dominant pattern signal, a new dominant pattern signal is prepared by changing one bit, representing a clock bit, of the previous dominant pattern signal.

Another example of operation of the test pattern generation device of the present invention will be described. In the second example, it is assumed that the sequential circuit to be tested is the circuit shown in FIG. 7, and the line to be tested is line 23. It is hypothetically set that a stuck-at 1 fault is observed at line 23.

Initially, input 22 is set to logic "1", and the Q output from the D flip-flop 24 is assumed as logic "X". From this initial condition, the simulation operation is carried out to obtain a set of test pattern signals for making the output 23 to logic "0". According to the circuit of FIG. 7, it is not possible to obtain a set of test patterns that can ensure the change of the output 23 with a one step change procedure, i.e., directly from logic "X" to logic "0". Thus, to ensure the output 23 to produce logic "0", it is necessary to follow a two step change procedure, i.e., first from logic "X" to logic "1", and then to logic "0".

The operations to obtain a set of test patterns are carried out by the flow chart shown in FIGS. 4a and 4b, and therefore, a description therefor is omitted for the sake of brevity.

Figures 7, 8:
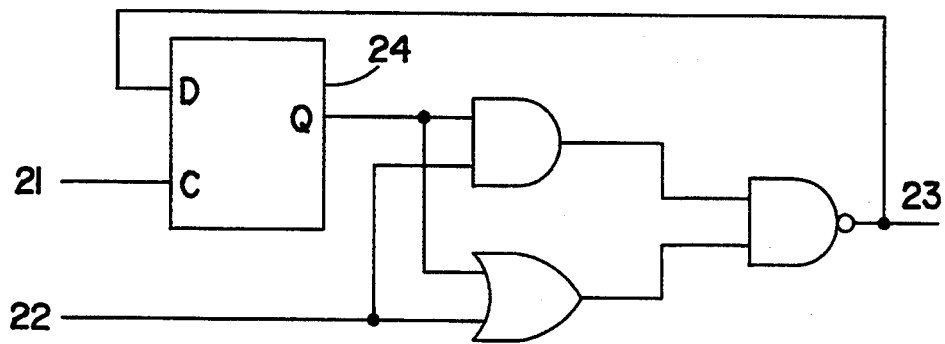
FIG. 7 is a circuit diagram of one test circuit used for explaining the present invention.
FIG. 8 is a diagram showing a continuous logic value used in the prior art devices.

If the prior art continuous logic value such as shown in FIG. 8 is employed, no test pattern signal that can change the state from logic "X" to logic "1" is available, because the prior art continuous logic value is not cyclic and therefore, from logic "0", a distance to logic "1" is greater than a distance to logic "X".

On the other hand, when the continuous cyclic logic value, shown in FIG. 2, of the present invention is used, from logic "0", a distance to logic "X" is equal to a distance to logic "1".

According to the present invention, the test sequence length, i.e., the number of test patterns generated in a set, can be reduced and the computing time can be shortened, because the continuous cyclic logic value indicating the degree of change due to the input pattern of the fault-set signal line $G_f$ and the cost indicating the number of procedures required to test the fault types at the fault-set signal line $G_f$ are used, and unnecessary searches in which the D flip-flop is changed are not performed.

A second embodiment of the present invention is described next. According to the second embodiment, a neural network is introduced to formulate a relationship between input and output the continuous cyclic logic values of an element.

The continuous cyclic logic values shown in FIG. 2 are used.

Figure 9:
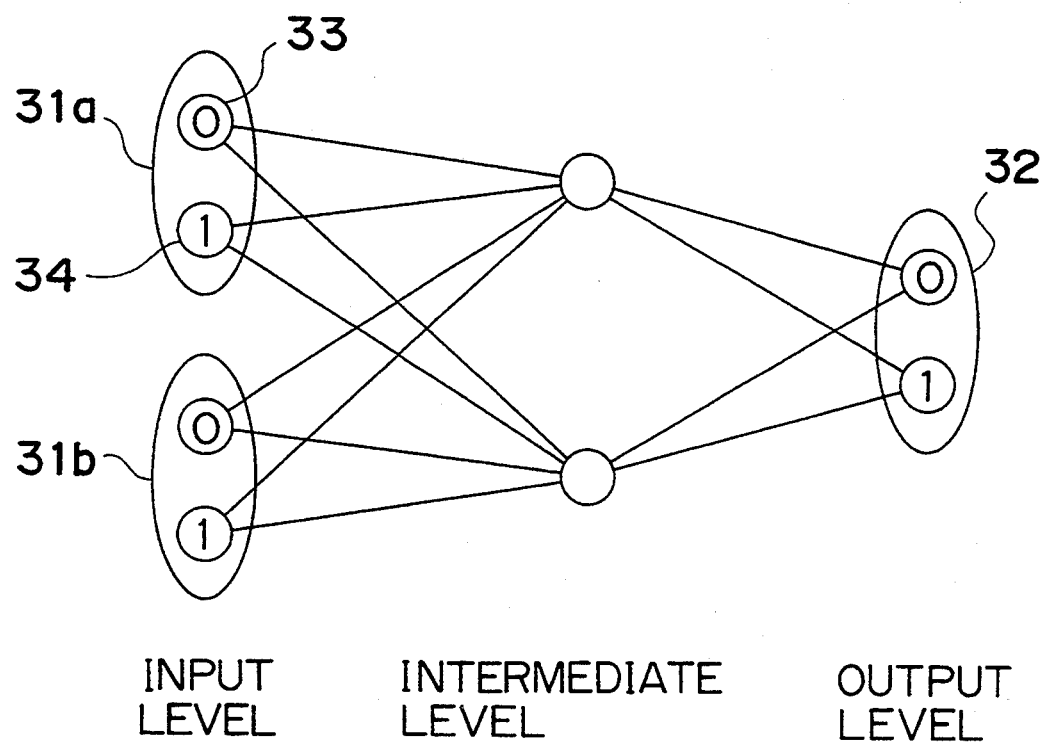
FIG. 9 is a diagram showing a neural network of a logic element having two inputs and one output.

The input/output relationship of each logic element, such as AND, OR, NOT, EX-OR, D flip-flop, is determined by the neural network shown in FIG. 9. The neural network is a three tier network with an input level, intermediate level, and output level as shown in FIG. 9. The continuous cyclic logic values of the input sections 31a and 31b and the output section 32 are expressed by two neurons, neuron 0 33 and neuron 1 34. The relationship between the continuous cyclic logic values and the two neurons is shown in Table 1 below.

TABLE 1

| Logic Value | Neuron 0 | Neuron 1 |
| --- | --- | --- |
| 0 | 1 | 0 |
| 1 | 0 | 1 |
| X | 0 | 0 |
|   | 1 | 1 |

When A is defined as continuous cyclic logic value, $X_0$ is defined as neuron 0, and $X_1$ is defined as neuron 1, conversion formulas for converting from the continuous cyclic logic value to neuron, and vice versa are shown below.

(continuous cyclic logic value)→(two neurons)

When $0 \leq A \leq 10$
$X_0 = 1 - A/10$
$X_1 = A/10$.
When $10 \leq A \leq 20$
$X_0 = 0$
$X_1 = (20-A)*0.07$.
When $20 \leq A \leq 30$
$X_0 = (A-20)*0.07$
$X_1 = 0$.

(two neurons)→(continuous cyclic logic value)

When $(X_0+X_1) < 0.75$
$A = (X_0-X_1)*10/0.7+20$.
When $0.75 \leq (X_0+X_1) \leq 1.25$
$A = (-X_0+X_1+1)*10/2$.
When $1.25 \leq (X_0+X_1)$
$A = (X_0-X_1)/(X_0+X_1-0.6)* 10+20$.

Only those points where the input is logic 0, logic 1, or logic X are used for training the neural network. Training is done by applying to the network the input data and the corresponding output logic value (0, 1, X) as the teacher data. A difference between the teacher data and the value obtained by the network is obtained and the difference is inversely propagated through the network to modify the network weight until the difference is decreased to a sufficiently low level. The training is terminated when the sum of the differences between the teacher data and the value obtained by the neural network is less than 0.05 multiplied by the teacher data number. A relationship between the input and output of an AND gate determined by this neural network is shown in a graph of FIG. 10.

Figure 10:
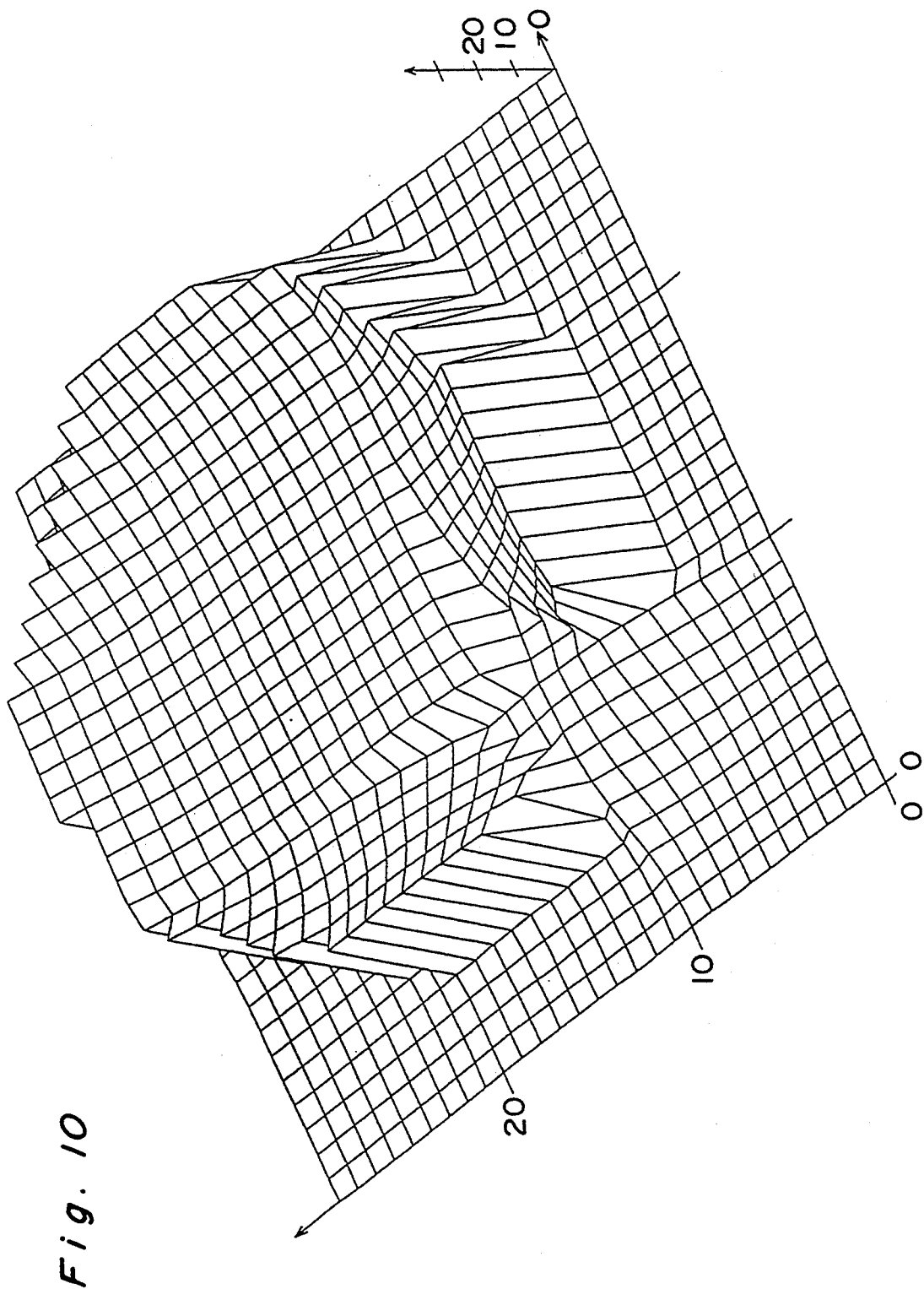
FIG. 10 is a graph showing the continuous cyclic logic values of an AND gate obtained by the neural network.

When the logic function table shown in FIGS. 12a, 12b, 12c and 12d and the graph shown in FIG. 10 are compared, very similar values are obtained. Moreover, if FIG. 10 is surveyed for the input between logic 0 and logic 1, there is a simple increase from logic 0 to logic 1, as the continuous cyclic logic value of the output increases. Thus, when two cases: one is when the input is logic (0,0), and the other is when the input is logic (0,1), are compared, the later case has a greater continuous cyclic logic value. Thus it is understood that, when the neural network is used, the input information is reflected in the output information. By learning only at the logic value peaks, the overall relationship between the input and output continuous logic cyclic value can be automatically determined. Using a logic element in which the relationship between the inputs and outputs is thus determined, the same circuit simulation described above can be performed, and it became easier to control the signal line at the faulty site.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A test pattern generation device for producing test pattern signals for testing a preselected digital circuit having a preselected line comprising:

means for producing a dominant pattern signal in a binary form;

means for producing a set of subservient pattern signals from said dominant pattern, each of said subservient pattern signals having a binary form and being unit Hamming distance from said dominant pattern signal;

means, responsive to each subservient pattern, for simulating an operation of the preselected digital circuit which produces a result;

means for producing, from the result of the simulation operation, a controllability cost at the preselected line in said digital circuit for each of said subservient pattern signals;

means for producing, from the result of the simulation operation, a continuous cyclic logic value at said preselected line for each of said subservient pattern signals, said continuous cyclic logic value having a continuous value which changes from logic "0" to logic "1", logic "1" to logic "unknown X", and logic "unknown X" to logic "0", said continuous logic value having a first distance from logic "0" to logic "unknown X" equal to a second distance from logic "unknown X" to logic "1", which is in turn equal to a third distance from logic "0" to logic "1";

means for producing an evaluation cost at said preselected line by the use of said controllability cost and said continuous cyclic logic value for each subservient pattern signal;

means for selecting from said set of subservient pattern signals the subservient pattern signal that produced a minimum evaluation cost; and test pattern memory means for storing said selected subservient pattern signal as one test pattern and assigning said selected subservient pattern signal as a next dominant pattern signal in a next cycle operation.

2. A test pattern generation device according to claim 1, wherein said selecting means comprises a memory for storing said minimum evaluation cost $CT_f$ for comparing the minimum evaluation cost $CT_f$ obtained in the previous cycle operation and that obtained in the present cycle operation, said selecting means selecting said subservient pattern signal from the present cycle operation when said minimum evaluation cost $CT_f$ obtained in the present cycle is smaller than that obtained in the previous cycle, and selecting a modified subservient pattern signal, which is a subservient pattern signal selected in the previous cycle with one bit representing a clock bit being changed, when said minimum evaluation cost $CT_f$ obtained in the present cycle is not smaller than that obtained in the previous cycle.

3. A test pattern generation device according to claim 1, wherein said simulating means produces at an output of each element, a controllability cost $CCO_i$ which represents the number of steps necessary to change the present output condition to logic "0", a controllability cost $CC1_i$ which represents the number of steps necessary to change the present output condition to logic "1", a controllability cost $CCP_i$ which represents the number of steps necessary to change the present output condition first to logic "0" and then to logic "1", and a controllability cost $CCN_i$ which represents the number of steps necessary to change the present output condition first to logic "1" and then to logic "0".

4. A test pattern generation device according to claim 1, wherein said evaluation cost producing means produces said evaluation cost $CT_f$ by the following equation:

$$CT_f = K1 \times CCT_f + K2 \times CCV_f$$

wherein K1 and K2 are predetermined constants, $CCT_f$ is a controllability cost which represents the number of steps necessary to change the present output condition to logic "T", and $CCV_f$ is a difference between the continuous cyclic logic value $CV_f$ and a desired continuous cyclic logic value $DCV_f$ of the preselected line $G_f$.

5. A test pattern generation device according to claim 1, wherein said means for producing said continuous cyclic logic value is a neural network.

* * * * *

UNITED STATES PATENT AND TRADEMARK OFFICE
CERTIFICATE OF CORRECTION

PATENT NO. : 5,341,315
DATED : August 23, 1994
INVENTOR(S) : Hisao Niwa, et. al.

It is certified that error appears in the above-indentified patent and that said Letters Patent is hereby corrected as shown below:

Title page, col. 2, line 11, Assistant Examiner should be-- Eric W. Stamber--.

Signed and Sealed this

Twenty-fourth Day of January, 1995

Attest:

BRUCE LEHMAN

Attesting Officer     Commissioner of Patents and Trademarks